US009054060B2

(12) United States Patent
Kang et al.

(10) Patent No.: US 9,054,060 B2
(45) Date of Patent: Jun. 9, 2015

(54) ORGANIC LIGHT-EMITTING DISPLAY DEVICE

(71) Applicant: SAMSUNG DISPLAY CO., LTD., Yongin, Gyeonggi-do (KR)

(72) Inventors: Tae-Wook Kang, Yongin (KR); Young-Seo Choi, Yongin (KR); Jin-Ho Kwack, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/010,681

(22) Filed: Aug. 27, 2013

(65) Prior Publication Data

US 2014/0061618 A1 Mar. 6, 2014

(30) Foreign Application Priority Data

Sep. 4, 2012 (KR) ........................ 10-2012-0097865

(51) Int. Cl.
*H01L 51/00* (2006.01)
*H01L 27/32* (2006.01)

(52) U.S. Cl.
CPC ........ *H01L 27/3272* (2013.01); *H01L 27/3276* (2013.01)

(58) Field of Classification Search
CPC ............ H01L 51/0542; H01L 51/0545; H01L 51/0036; H01L 51/0541; H01L 51/5012
USPC ...................... 257/40, 642, 643, 759, E51.022
See application file for complete search history.

(56) References Cited

U.S. PATENT DOCUMENTS

| 7,510,913 | B2 | 3/2009 | Moro et al. | |
|---|---|---|---|---|
| 7,612,498 | B2 | 11/2009 | Sano et al. | |
| 7,648,925 | B2 | 1/2010 | Moro et al. | |
| 7,727,601 | B2 | 6/2010 | Burrows et al. | |
| 8,030,841 | B2 | 10/2011 | Kwack et al. | |
| 8,599,112 | B2 * | 12/2013 | Yamashita et al. | 345/76 |
| 2007/0049155 | A1 | 3/2007 | Moro et al. | |
| 2009/0191342 | A1 | 7/2009 | Chu et al. | |
| 2009/0208754 | A1 | 8/2009 | Chu et al. | |
| 2010/0156277 | A1 | 6/2010 | Visser et al. | |
| 2010/0159792 | A1 | 6/2010 | Visser et al. | |

FOREIGN PATENT DOCUMENTS

| JP | 2005-157141 A | 6/2005 |
|---|---|---|
| KR | 10-0730220 B1 | 6/2007 |
| KR | 10-2009-0112387 A | 10/2009 |

* cited by examiner

*Primary Examiner* — Quoc Hoang
(74) *Attorney, Agent, or Firm* — Robert E. Bushnell, Esq.

(57) ABSTRACT

An organic light-emitting display device including a substrate on which a display region and a non-display region are defined is described, the organic light-emitting display device comprising: a first electrode disposed on a substrate; an intermediate layer disposed on the first electrode and including an organic light-emitting layer; a second electrode disposed on the intermediate layer; an encapsulation layer disposed on the substrate; a plurality of pad units disposed on the non-display region; a wiring unit disposed on the display region; and a bridge wiring that is disposed across the display region and the non-display region and connects one of the plurality of pad units and the wiring unit to each other.

24 Claims, 6 Drawing Sheets

ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 4 Sep. 2012, and there duly assigned Serial No. 10-2012-0097865.

BACKGROUND OF THE INVENTION

1. Field of the Invention

The present invention relates to an organic light-emitting display device and a means of more effectively isolating it from external materials that might damage it.

2. Description of the Related Art

Organic light-emitting display devices using an organic light-emitting device may provide a superior moving image such as a video because they have a faster response time than liquid crystal display (LCD) devices that are currently in widespread use and may offer a wide viewing angle and a high brightness because they themselves emit light. Accordingly, organic light-emitting display devices are spotlighted as next-generation display devices.

An organic light-emitting device includes a pixel electrode and a counter electrode facing each other and an emission layer including an organic material that is disposed between the pixel electrode and the counter electrode. When the organic light-emitting device, which is highly vulnerable to moisture, oxygen, and light, comes into contact with moisture, oxygen, or light, the organic light-emitting device may be degraded. Also, when oxygen or moisture diffuses into the emission layer including the organic material, charges migrate during an electrochemical reaction at an interface between the pixel electrode and the emission layer or between the counter electrode and the emission layer, the emission layer including the organic material, to produce an oxide. The oxide then separates the emission layer including the organic material from either the pixel electrode or the counter electrode to generate dark spots or the like, thereby reducing the lifetime of the organic light-emitting device. Accordingly, a sealing technology for preventing external moisture, oxygen, or light from penetrating into the organic light-emitting device is typically used to protect the organic light-emitting device.

SUMMARY OF THE INVENTION

The present invention provides an organic light-emitting display device that prevents impurities from penetrating into the organic light-emitting display device through a boundary between an encapsulation unit, which includes the display region of the device, and a pad unit, which is located in the non-display region of the device and includes wiring and circuitry that supports the device.

According to one embodiment of the present invention, there is provided an organic light-emitting display device including a substrate on which a display region and a non-display region are defined; a first electrode disposed on the substrate; an intermediate layer disposed on the first electrode and including an organic light-emitting layer; a second electrode disposed on the intermediate layer; an encapsulation layer disposed on the substrate; a plurality of pad units disposed on the non-display region; a wiring unit disposed on the display region; and a bridge wiring that is disposed across the display region and the non-display region and connects one of the plurality of pad units and the wiring unit to each other.

The pad units and the wiring unit may be formed at the same layer level.

The bridge wiring may be formed on a different layer from the pad unit and the wiring unit.

The pad unit and the wiring unit may be formed on an interlevel insulating layer formed on the substrate.

The organic light-emitting display device may further include a gate insulating layer formed between the substrate and the interlevel insulating layer, and the bridge wiring may be formed on the gate insulating layer.

The wiring unit may be connected to the bridge wiring through a via hole in the display region.

One of the plurality of pad units may be connected to the bridge wiring through a second via hole in the second non-display region.

The encapsulation layer may include a first portion including a first thin film and a second thin film that are alternately stacked on each other, the first portion being on the substrate the encapsulation layer further comprising a second portion including the first thin film only.

The first portion may be disposed on the display region, and the second portion may be disposed on the non-display region and cover one of the plurality of pad units.

The second portion may include an opening through which a portion of one of the plurality of pad units may be exposed outward.

An end of the second thin film may be surrounded by the first thin film.

The first thin film may be formed of an inorganic material.

The second thin film may be formed of an organic material.

The organic light-emitting display device may further include a thin film transistor (TFT) that is disposed on the substrate, is electrically connected to the first electrode, and may include an active layer, a source electrode, a drain electrode, and a gate electrode.

One of the plurality of pad units or the wiring unit may be formed of the same material as the source electrode or the drain electrode, and may be formed at the same layer level as the source electrode or the drain electrode.

The first electrode and the gate electrode may be formed at the same layer level.

The gate electrode may include a first conductive layer and a second conductive layer formed on the first conductive layer, and the first electrode may be formed of the same material as the first conductive layer.

The bridge wiring may be formed of the same material as the gate electrode and is formed at the same layer level as the gate electrode.

The first electrode may include a transmissive conductive material.

According to another embodiment of the present invention, there is provided an organic light-emitting display device including a substrate on which a display region and a non-display region are defined; a first electrode disposed on the substrate; an intermediate layer disposed on the first electrode and including an organic light-emitting layer; a second electrode disposed on the intermediate layer; an encapsulation layer disposed on the substrate, the encapsulation layer comprising an encapsulation unit; a plurality of pad units disposed on the non-display region; a wiring unit disposed on the display region; and a bridge wiring that is disposed across the display region and the non-display region and connects one of the plurality of pad units and the wiring unit to each other, the wiring unit being connected to the bridge wiring through a first via hole on the display region, the pad unit being connected to the bridge wiring through a second via hole on the non-display region, the encapsulation unit including a first portion including a first thin film and a second thin film that are alternately stacked on the substrate the encapsulation unit further including a second portion including the first thin film only.

The first via hole may include a first inner surface portion facing the display region and a second inner surface portion facing the non-display region.

The second inner surface portion may be formed closer to a central portion of the display region than is an external side surface of the second thin film that is positioned at an outermost portion of a plurality of the second thin films.

The second via hole may include a third inner surface portion facing the display region and a fourth inner surface portion facing the non-display region.

The third inner surface portion may be formed closer to a central portion of the display region than is an external side surface of the second thin film that is positioned at an outermost portion of a plurality of the second thin films.

BRIEF DESCRIPTION OF THE DRAWINGS

A more complete appreciation of the invention and many of the attendant advantages thereof will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
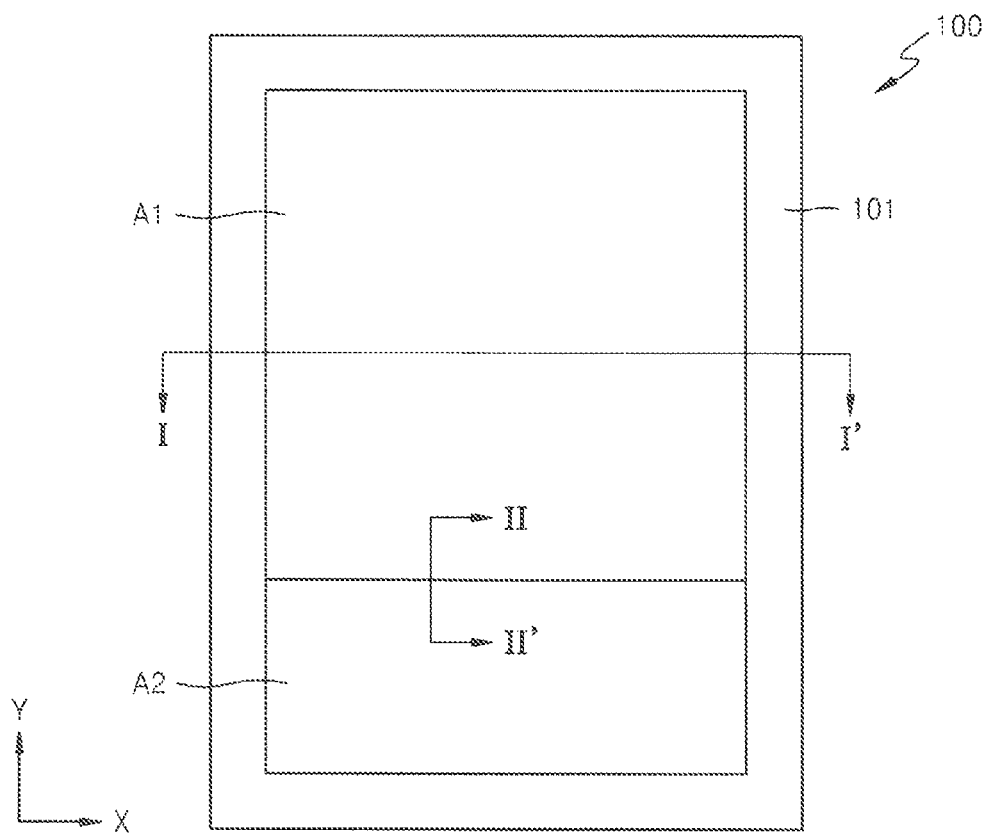
FIG. 1 is a plan view of an organic light-emitting display device according to an embodiment of the present invention.
Figure 2:
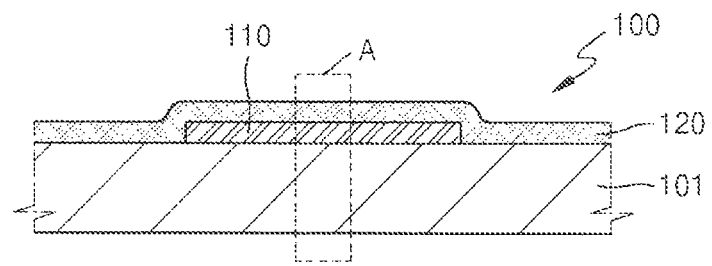
FIG. 2 is a cross-sectional view of the organic light-emitting display device taken along a line I-I' of FIG. 1, according to an embodiment of the present invention.
Figure 3:
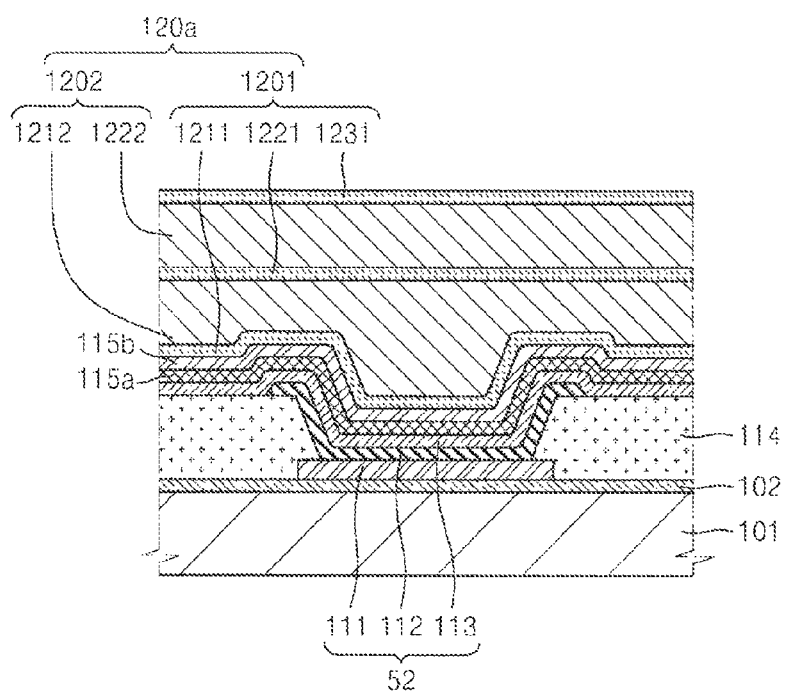
FIG. 3 is an enlarged cross-sectional view of a portion 'A' of FIG. 2, according to an embodiment of the present invention.
Figure 4:
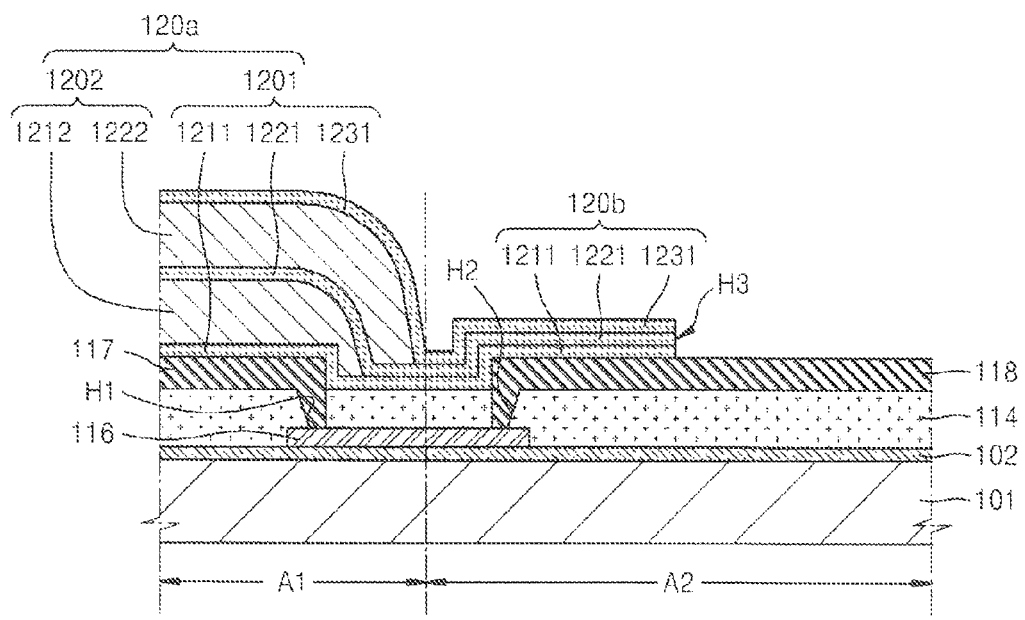
FIG. 4 is a cross-sectional view of the organic light-emitting display device taken along a line II-II' of FIG. 1, according to an embodiment of the present invention.

FIG. 1 is a plan view of an organic light-emitting display device 100 according to an embodiment of the present invention. FIG. 2 is a cross-sectional view of the organic light-emitting display device 100 taken along a line I-I' of FIG. 1, according to an embodiment of the present invention. FIG. 3 is an enlarged cross-sectional view of a portion 'A' of FIG. 2, according to an embodiment of the present invention. FIG. 4 is a cross-sectional view of the organic light-emitting display device 100 taken along a line II-II' of FIG. 1, according to an embodiment of the present invention.

Referring to FIGS. 1 through 4, the organic light-emitting display device 100 includes a substrate 101, an organic light-emitting unit 110, and an encapsulation unit 120.

The substrate 101 may be formed of a glass material having $SiO_2$ as a main component. The substrate 101 is not limited thereto and may be formed of a transparent plastic material. A plastic substrate may be formed of an insulating organic material that is selected from polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

Alternatively, the substrate 101 may be formed of metal and may be in the form of a foil.

A display region A1 and a non-display region A2 are defined on the substrate 101. FIG. 1 shows a case where the non-display region A2 is positioned at one side edge of the display region A1. However, the present invention is not limited thereto. That is, the non-display region A2 may be positioned at one side edge and its opposite side edge of the display region A1, or, alternatively, may be positioned to surround the display region A1.

The organic light-emitting unit 110 including a plurality of organic light-emitting devices 52 that emit rays visible to a user may be disposed on the display region A1. In addition, each of the organic light-emitting devices 52 may include a first electrode 111, an intermediate layer 112, and a second electrode 113, which are shown in FIG. 3 and will be described below.

A pad unit 118 is disposed on the non-display region A2. The pad unit 118 transfers electrical signals or power to the display region A1. For example, an electrical signal generated from a driving circuit unit (not shown) is transmitted to the display region A1 through the pad unit 118, which is shown in FIG. 4 in detail and will be described below.

The encapsulation unit 120 may be disposed on the substrate 101 so as to prevent external moisture, air, or the like from penetrating into a thin film transistor (TFT), a light-emitting pixel, and the like included on the substrate 101. The encapsulation unit 120 seals the organic light-emitting unit 110 on the substrate 101. The encapsulation unit 120 may be formed as a plurality of thin films, which will be described below.

FIG. 2 is a cross-sectional view of the organic light-emitting display device 100 taken along a line I-I' of FIG. 1, according to an embodiment of the present invention. FIG. 3 is an enlarged cross-sectional view of a portion 'A' of FIG. 2, according to an embodiment of the present invention.

Referring to FIGS. 2 and 3, the organic light-emitting display device 100 includes the substrate 101, the organic light-emitting unit 110, and the encapsulation unit 120.

The organic light-emitting unit 110 including a light-emitting device is disposed on the substrate 101. The organic light-emitting unit 110 may include the plurality of organic light-emitting devices 52.

Each of the organic light-emitting devices 52 includes the first electrode 111, the intermediate layer 112, and the second electrode 113.

The first electrode 111 and the second electrode 113 may be used as an anode and a cathode, respectively. However, the present invention is not limited thereto, and polarities of the first electrode 111 and the second electrode 113 may be switched and thus the first electrode 111 and the second electrode 113 may be used as a cathode and an anode, respectively.

If the organic light-emitting display device 100 is a bottom emission organic light-emitting display device in which an image is formed toward the substrate 101, the first electrode 111 is a transparent electrode and the second electrode 113 is a reflective electrode. Alternatively, if the organic light-emitting display device 100 is a top emission organic light-emitting display device in which an image is formed toward the encapsulation unit 120, the first electrode 111 is a reflective electrode and the second electrode 113 is a transparent electrode.

The transparent electrode may include at least one selected from indium tin oxide (ITO), indium zinc oxide (IZO), zinc oxide (ZnO), indium oxide ($In_2O_3$), indium gallium oxide (IGO), and aluminum zinc oxide (AZO).

The reflective electrode may be formed by thinly depositing a metal having a low work function, such as one of silver (Ag), magnesium (Mg), aluminum (Al), platinum (Pt), palladium (Pd), gold (Au), nickel (Ni), neodymium (Nd) iridium (Ir), chromium (Cr), lithium (Li), LiF/Ca, LiF/Al, an alloy thereof, and a compound thereof.

A surface of the first electrode 111 is exposed by a pixel defining film 114. The pixel defining film 114 formed of at least one organic insulating material selected from polyimide, polyamide, acrylic resin, benzocyclobutene, and phenol resin may be formed by using spin coating or the like. Alternatively, the pixel defining film 114 may be formed of an inorganic insulating material selected from $SiO_2$, $SiN_x$, $Al_2O_3$, $CuO_x$, $Tb_4O_7$, $Y_2O_3$, $Nb_2O_5$, and $Pr_2O_3$. Alternatively, the pixel defining film 114 may be formed to have a multi-layer structure in which an organic insulating material and an inorganic insulating material are alternately stacked.

The intermediate layer 112 is disposed between the first electrode 111 and the second electrode 113. The intermediate layer 112 may be formed to have a single-layer structure or a multi-layer structure in which one or more layers selected from an organic emissive layer (EML), a hole transport layer (HTL), a hole injection layer (HIL), an electron transport layer (ETL), and an electron injection layer (EIL) are stacked.

The organic EML may include a low molecular weight or a high molecular weight organic material.

If the organic EML is formed of a low molecular weight organic material, the intermediate layer 112 is configured such that, with respect to the organic EML, the HTL and the HIL are stacked toward the first electrode 111, and the ETL and the EIL are stacked toward the second electrode 113. If necessary, various other layers may be stacked. In this case, examples of the low molecular weight organic material may include copper phthalocyanine (CuPc), N,N'-Di(naphthalene-1-yl)-N,N'-diphenyl-benzidine (NPB), and tris-8-hydroxyquinoline aluminum ($Alq_3$).

If the organic EML is formed of a high molecular weight organic material, the intermediate layer 112 may include only the HTL stacked toward the first electrode 111 with respect to the organic EML. An HTL formed of poly(3,4-ethylenedioxythiophene) (PEDOT) or polyaniline (PANI) may be formed on the first electrode 111 by using inkjet printing or spin coating. Examples of the high molecular weight organic material may include polyphenylene vinylene (PPV)-based high molecular weight organic material and polyfluorene-based high molecular weight organic material. A color pattern may be formed by using a typical method such as inkjet printing, spin coating, or laser-induced thermal imaging.

A first layer 115a and a second layer 115b may be stacked on the second electrode 113. The first layer 115a protects the intermediate layer 112 from plasma damage or ultra violet damage during a subsequent thin film process. The second layer 115b increases extraction efficiency of light generated from the organic light-emitting devices 52.

The encapsulation unit 120 seals the organic light-emitting unit 110. The encapsulation unit 120 may include a first portion 120a formed on the display region A1 and a second portion 120b formed on the non-display region A2.

The first portion 120a may include first thin films 1201 and second thin films 1202 that are alternately stacked on each other and the second portion 120b may include first thin films 1211, 1221, and 1231 that are stacked.

The first thin films 1201 may be formed to surround ends of the second thin films 1202. That is, second thin films 1212 and 1222 may be interposed between the first thin films 1211, 1221, and 1231, respectively, and the second thin films 1212 and 1222 may be completely surrounded by the first thin films 1211, 1221, and 1231.

The first thin films 1211, 1221, and 1231 may be formed of an inorganic material and may function as barrier layers. For example, the first thin films 1211, 1221, and 1231 may be formed of $AlO_x$, $Al_2O_3$, $SiN_x$, $Si_3N_4$, ZrO, Al-doped zinc oxide (AZO), or SiOx. In addition, each of the first thin films 1211, 1221, and 1231 may be formed as two or more layers formed of these materials. The first thin films 1211, 1221, and 1231 may be formed by thermal evaporation, E-beam evaporation, radio-frequency (RF) sputtering, reactive sputtering, atomic layer deposition (ALD), plasma enhanced chemical vapor deposition (PECVD), or the like.

The second thin films 1212 and 1222 may be formed of an organic material and may be formed as a planarization layer. For example, the second thin films 1212 and 1222 may be formed of acrylic monomer, silicon-based monomer, epoxy-based monomer, or a polymer formed by hardening of monomer formed by mixing at least one of the foregoing with a hardening agent. The second thin films 1212 and 1222 formed of a polymer formed by hardening acrylic monomer may be formed by thermal evaporation. The second thin films 1212 and 1222 may be formed to have a greater thickness than that of the first thin films 1211, 1221, and 1231.

FIG. 4 is a cross-sectional view of the organic light-emitting display device 100 taken along a line II-II' of FIG. 1, according to an embodiment of the present invention. In detail, FIG. 4 is a cross-sectional view showing a display region A1 and a non-display region A2.

Referring to FIG. 4, a buffer layer 102 is formed on the substrate 101 and a bridge wiring 116 is formed on the buffer layer 102. The bridge wiring 116 may be formed across the display region A1 and the non-display region A2 on the buffer layer 102. That is, a portion of the bridge wiring 116 is disposed on the display region A1 and another portion is disposed on the non-display region A2.

An insulating layer 114 may be formed on the buffer layer 102 so as to cover the bridge wiring 116. The insulating layer 114 may be an interlevel insulating layer.

A wiring unit 117 and the pad unit 118 are formed on the insulating layer 114. The wiring unit 117 is formed on the display region A1 and the pad unit 118 is formed on the non-display region A2. The wiring unit 117 and the pad unit 118 are formed so as to be disconnected from each other but are electrically connected through the bridge wiring 116. That is, the wiring unit 117 and the pad unit 118 are connected to the bridge wiring 116 through first and second via holes H1 and H2, respectively. The first via hole H1 is formed in the insulating layer 114 in the display region A1 so as to connect the wiring unit 117 and the bridge wiring 116 to each other and the second via hole H2 is formed in the insulating layer 114 in the non-display region A2 so as to connect the pad unit 118 and the bridge wiring 116 to each other.

Likewise, the pad unit 118 and the wiring unit 117 are not connected directly to each other at a boundary between the display region A1 and the non-display region A2 but are connected to each other through the bridge wiring 116 that is formed as a different layer from the pad unit 118 and the wiring unit 117, thereby preventing a liquid-state material of the second thin film 1212 or a diffused component of the second thin film 1212 from being introduced through the wiring unit 117 at the boundary between the display region A1 and the non-display region A2. Such incursion of a second thin film 1212 component through the wiring unit 117 would damage the organic light-emitting devices 52 (i.e., the intermediate layer 112 including an emissive layer) during the formation of the second thin film 1212.

Advantages of the present invention will be described below with reference to FIGS. 5 and 6.

Figure 5:
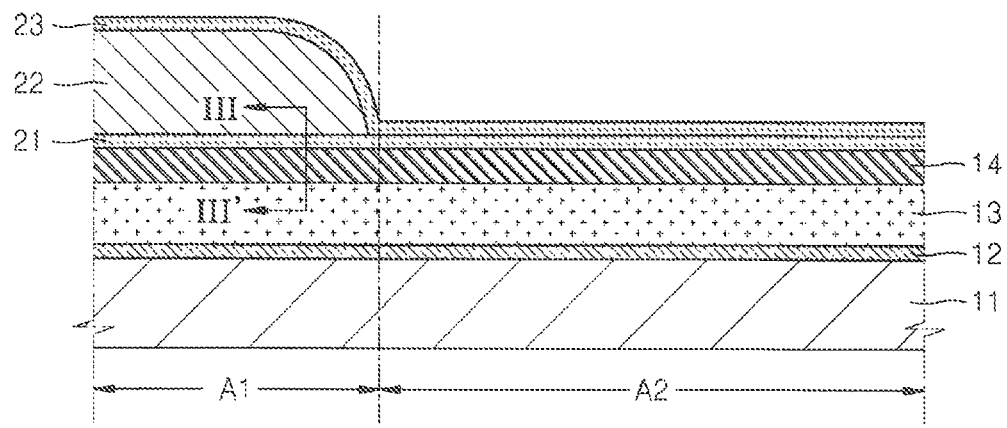
FIG. 5 is a cross-sectional view of a conventional organic light-emitting display device.

FIG. 5 is a cross-sectional view of a conventional organic light-emitting display device, and, in detail, shows a boundary between the display region A1 and the non-display region A2. FIG. 6 is a cross-sectional view of the conventional organic light-emitting display device taken along a line III-III' of FIG. 5.

Figure 6:
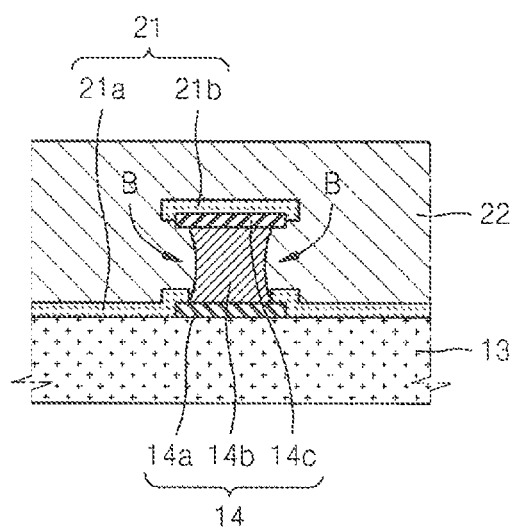
FIG. 6 is a cross-sectional view of the conventional organic light-emitting display device taken along a line III-III' of FIG. 5.

Referring to FIGS. 5 and 6, the conventional organic light-emitting display device includes a buffer layer 12, an insulating layer 13, a wiring unit 14, and encapsulation units 21, 22, and 23, which are formed on a substrate 11. In the conventional organic light-emitting display device, the wiring unit 14 is formed across the display region A1 and the non-display region A2 on the insulating layer 13, and the wiring unit 14 functions as a pad unit on the non-display region A2. As shown in FIG. 6, the wiring unit 14 may include three layers, 14a, 14b, and 14c. For example, layers 14a, 14b and 14c may be Ti—Al—Ti layers.

When three layers, that is, wiring units 14a, 14b, and 14c are formed and then a photolithography process is performed in order to form a pixel defining film or a spacer, the wiring units 14a, 14b, and 14c may have an overhang structure formed by etching a portion of the wiring unit 14b formed of Al, as shown in FIG. 6. When the encapsulation unit 21 is formed on the wiring units 14a, 14b, and 14c having the overhang structure, the encapsulation unit 21 does not completely cover the wiring units 14a, 14b, and 14c, that is, a partial encapsulation unit 21a is formed on the insulating layer 13, another partial encapsulation unit 21b is formed on the wiring unit 14b, and the encapsulation unit 21 is not formed on the wiring unit 14b. Likewise, an organic material for forming the encapsulation unit 22 or a diffused component of the encapsulation unit 22 may penetrate into an organic light-emitting device through the wiring unit 14b that is not covered by the encapsulation unit 21, with damage to the organic light-emitting device. The arrows labeled "B" in FIG. 6 show the direction of possible incursion of encapsulating layer components into wiring unit 14 in the conventional art.

However, in the organic light-emitting display device 100 according to an embodiment of the present invention, the pad unit 118 and the wiring unit 117 are not connected directly to each other at a boundary between the display region A1 and the non-display region A2 but are connected to each other through the bridge wiring 116 that is formed as a different layer from the pad unit 118 and the wiring unit 117, thereby preventing a liquid-state material of the second thin film 1212 or a diffused component of the second thin film 1212 from being introduced through the wiring unit 117 at the boundary between the display region A1 and the non-display region A2. Such an incursion of a component of second thin film 1212 through wiring unit 117 would damage the organic light-emitting devices 52, that is, the intermediate layer 112 including an emissive layer, during the formation of the second thin film 1212, as described above.

Figure 7:
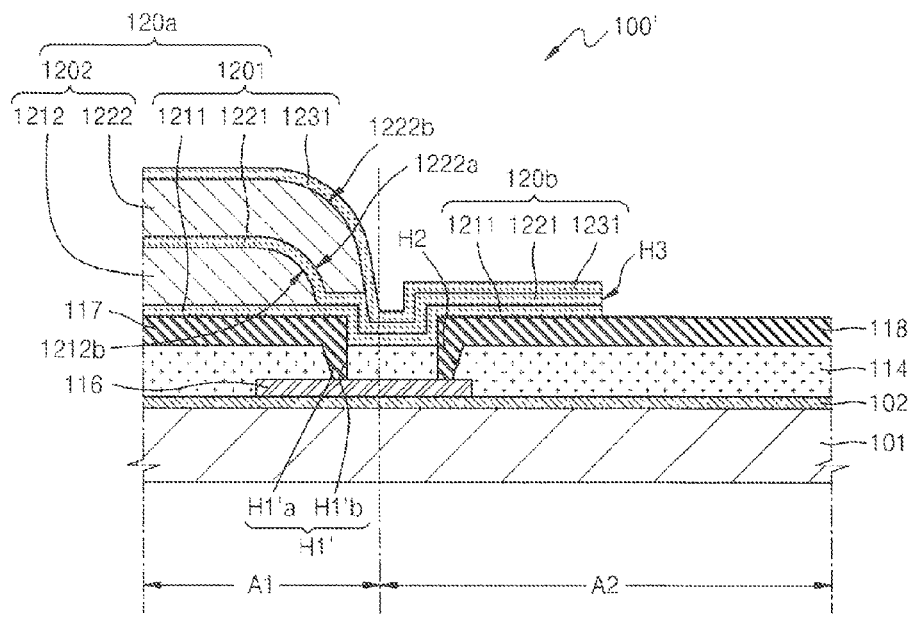
FIG. 7 is a cross-sectional view of an organic light-emitting display device that is a modified example of the organic light-emitting display device of FIG. 4.

FIG. 7 is a cross-sectional view of an organic light-emitting display device 100' that is a modified example of the organic light-emitting display device 100 of FIG. 4.

The organic light-emitting display device 100' of FIG. 7 is different from the organic light-emitting display device 100 of FIG. 4 in terms of a position of a first via hole H1'. That is, the first via hole H1' of the organic light-emitting display device 100' of FIG. 7 may be formed under the second thin film 1222, not under the second thin film 1212 whose end portion is closer to a central portion of the display region A1 than the end portion of the second thin film 1222. In more detail, the first via hole H1' may include a first inner surface portion H1'a facing the display region A1 and a second inner surface portion H1'b facing the non-display region A2. The second inner surface portion H1'b may be formed closer to a central portion of the display region A1 than an external side surface 1222b of the second thin film 1222 that is positioned at an outermost portion of the second thin films 1212 and 1222. As another modified example, the second inner surface portion H1'b may be disposed between the external side surface 1222b of the second thin film 1222 and an external side surface 1212b of the second thin film 1212 that is disposed inside the second thin film 1222.

Figure 8:
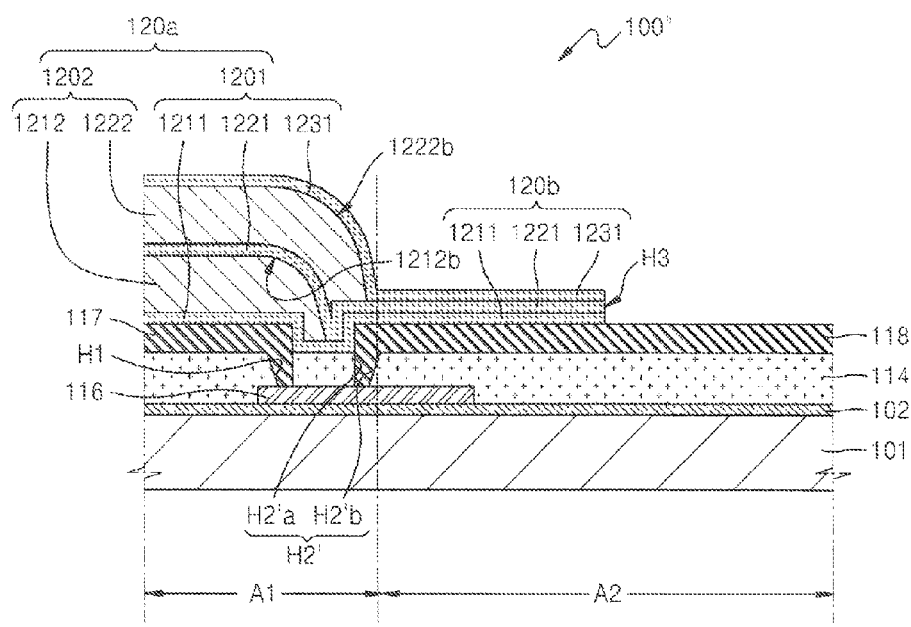
FIG. 8 is a cross-sectional view of an organic light-emitting display device that is another modified example of the organic light-emitting display device of FIG. 4.

FIG. 8 is a cross-sectional view of an organic light-emitting display device 100'' that is another modified example of the organic light-emitting display device 100 of FIG. 4.

The organic light-emitting display device 100'' of FIG. 8 is different from the organic light-emitting display device 100 of FIG. 4 in terms of a position of a second via hole H2'. That is, the second via hole H2' of the organic light-emitting display device 100'' of FIG. 8 may be formed under the second thin film 1222. In more detail, the second via hole H2' may include a third inner surface portion H2'a facing the display region A1 and a fourth inner surface portion H2'b facing the non-display region A2. The third inner surface portion H2'a may be formed closer to a central portion of the display region A1 than the external side surface 1222b of the second thin film 1222 that is positioned at an outermost portion of the second thin films 1212 and 1222. As another modified example, the third inner surface portion H2'a may be disposed between the external side surface 1222b of the second thin film 1222 and the external side surface 1212b of the second thin films 1212 that is disposed inside the second thin film 1222.

As described above, although the second inner surface portion H1'b of the first via hole H1' and the third inner surface portion H2'a of the second via hole H2' are disposed inside the external side surface 1222b of the second thin film 1222 that is an outermost portion, since the second thin film 1212 is disposed inside the second thin film 1222, impurities such as external moisture and so on may be prevented from penetrating.

Figure 9:
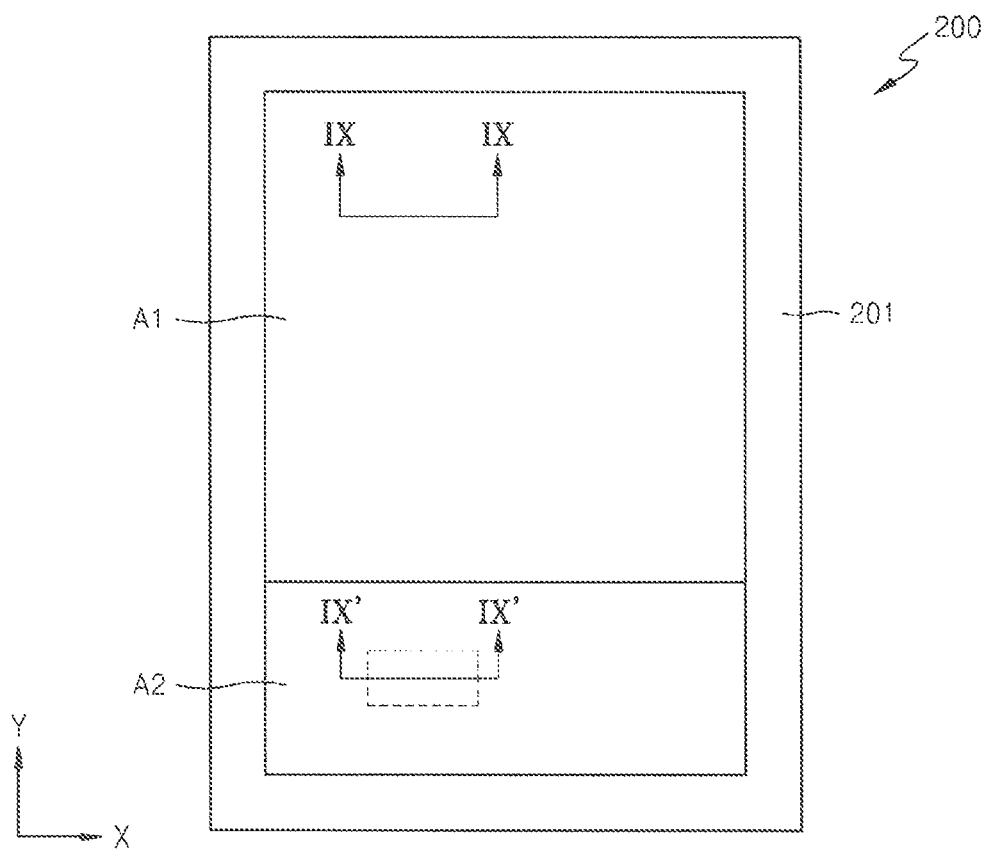
FIG. 9 is a schematic plan view of an organic light-emitting display device according to another embodiment of the present invention.
Figure 10:
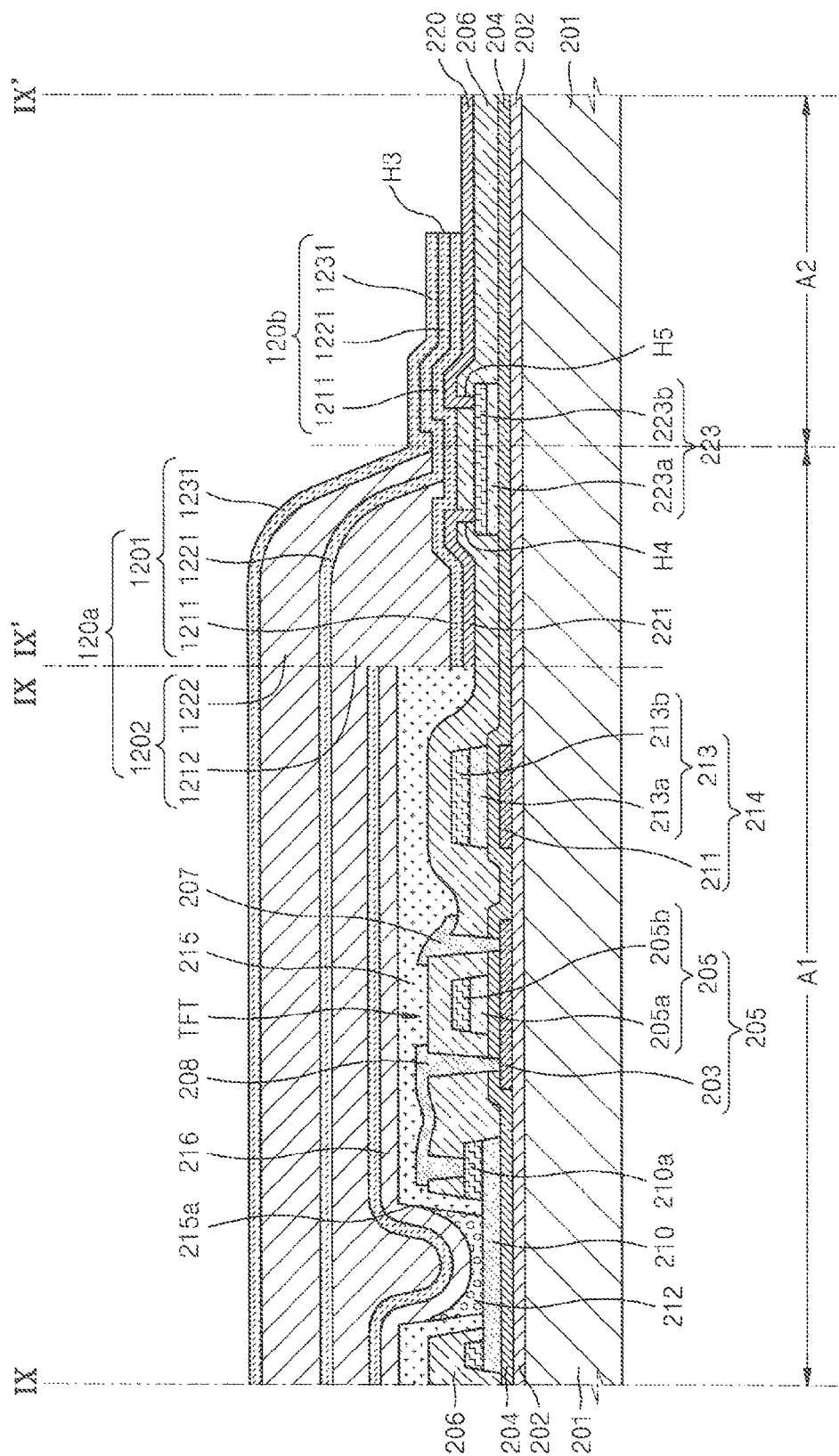
FIG. 10 is a cross-sectional view of the organic light-emitting display device taken along lines IX-IX and IX'-IX' of FIG. 9.

FIG. 9 is a schematic plan view of an organic light-emitting display device 200 according to another embodiment of the present invention. FIG. 10 is a cross-sectional view of the organic light-emitting display device 200 taken along lines IX-IX and IX'-IX' of FIG. 9. For convenience of description, the organic light-emitting display device 200 will be described with respect to features that are different from those of the aforementioned embodiment.

Referring to the embodiment of the invention represented by FIGS. 9 and 10, an organic light-emitting display device 200 includes a substrate 201, a first electrode 210, an intermediate layer 212, a second electrode 216, a wiring unit 221, a pad unit 220, a bridge wiring 223, an insulating layer 215, and an encapsulation unit 120.

The display region A1 and the non-display region A2 are defined on the substrate 201. FIG. 9 shows a case where the non-display region A2 is positioned at one side edge of the display region A1. However, the present invention is not limited thereto. That is, the non-display region A2 may be positioned at one side edge and the opposite side edge of the display region A1, or alternatively, may be positioned to surround the display region A1.

The display region A1 includes a plurality of organic light-emitting devices (not shown) generating light rays that are visible to a user. In addition, each of the organic light-emitting devices includes the first electrode 210, the intermediate layer 212, and the second electrode 216. A thin film transistor (TFT) that is electrically connected to the first electrode 210 is disposed on the display region A1. The TFT includes an active layer 203, a gate electrode 205, a source electrode 207, and a drain electrode 208. In addition, a capacitor 214 is disposed on the display region A1 and includes a first capacitor electrode 211 and a second capacitor electrode 213, which will be described below.

The pad unit 220 is disposed on the non-display region A2. The pad unit 220 transfers electrical signals or power to the display region A1. For example, an electrical signal generated from a driving circuit unit (not shown) is transmitted to the display region A1 through the pad unit 220.

A buffer layer 202 may be formed on the substrate 201. The buffer layer 202 may be formed across the display region A1 and the non-display region A2.

The active layer 203 may be formed on the buffer layer 202. In addition, the first capacitor electrode 211 may be formed on the buffer layer 202. The first capacitor electrode 211 may be formed of the same material as the active layer 203.

A gate insulating layer 204 may be formed on the buffer layer 202 so as to cover the active layer 203 and the first capacitor electrode 211. The gate insulating layer 204 may be formed across the display region A1 and the non-display region A2.

The gate electrode 205, the first electrode 210, the second capacitor electrode 213, and the bridge wiring 223 may be formed on the gate insulating layer 204.

The gate electrode 205 may include a first conductive layer 205*a* and a second conductive layer 205*b*. The first conductive layer 205*a* may include a transmissive conductive material, and, in detail, may include at least one selected from indium tin oxide (ITO), indium zinc oxide (IZO), zinc oxide (ZnO), indium oxide ($In_2O_3$), indium gallium oxide (IGO), and aluminum zinc oxide (AZO). The second conductive layer 205*b* may be formed on the first conductive layer 205*a* and may include, but is not limited to, one of a metal such as Mo, MoW, an Al-based alloy and an alloy of metal.

The first electrode 210 may include a light transmissive, conductive material and may be formed of the same material as the first conductive layer 205*a*. A conductive unit 210*a* is disposed on a predetermined portion of the first electrode 210 and is formed of the same material as the second conductive layer 205*b*.

The second capacitor electrode 213 may include a first layer 213*a* and a second layer 213*b*. The first layer 213*a* may be formed of the same material as the first conductive layer 205*a*, and the second layer 213*b* may be formed of the same material as the second conductive layer 205*b*.

The bridge wiring 223 may include a first wiring layer 223*a* and a second wiring layer 223*b*. The first wiring layer 223*a* may be formed of the same material as the first conductive layer 205*a* and the second wiring layer 223*b* may be formed of the same material as the second conductive layer 205*b*. The bridge wiring 223 may be formed on the gate insulating layer 204 across the display region A1 and the non-display region A2. That is, an end of the bridge wiring 223 may be positioned on the display region A1 and the other end of the bridge wiring 223 may be positioned on the non-display region A2. The wiring unit 221 and the pad unit 220 may be electrically connected to each other through the bridge wiring 223. The bridge wiring 223 may be connected to the wiring unit 221 on the display region A1 and may be connected to the pad unit 220 on the non-display region A2, which will be described below.

An interlevel insulating layer 206 may be formed on the first electrode 210, the gate electrode 205, and the second capacitor electrode 213. The interlevel insulating layer 206 may include various insulating materials such as organic materials or inorganic materials. The interlevel insulating layer 206 may be formed across the display region A1 and the non-display region A2.

The source electrode 207, the drain electrode 208, and the wiring unit 221 may be formed on the interlevel insulating layer 206 of the display region A1. The source electrode 207 and the drain electrode 208 may be formed to be connected to the active layer 203.

In addition, any one of the source electrode 207 and the drain electrode 208 may be electrically connected to the first electrode 210. In this regard, FIG. 10 shows a case where the drain electrode 208 is electrically connected to the first electrode 210. In detail, the drain electrode 208 contacts the conductive unit 210*a*.

The wiring unit 221 may be formed of the same material as the source/drain electrodes 207 and 208. The source/drain electrodes 207 and 208 and the wiring unit 221 may each include three layers. For example, the source/drain electrodes 207 and 208 and the wiring unit 221 may each include three layers, that is, Ti—Al—Ti layers.

The wiring unit 221 may be simultaneously formed with the source electrode 207 or the drain electrode 208 by using a patterning process.

The wiring unit 221 may be connected to the bridge wiring 223 on the display region A1. That is, since the wiring unit 221 may be disposed on the interlevel insulating layer 206, and the bridge wiring 223 may be disposed on the gate insulating layer 204, the interlevel insulating layer 206 may be positioned between the wiring unit 221 and the bridge wiring 223. A via hole H4 may be formed in the interlevel insulating layer 206, and thus, the wiring unit 221 and the bridge wiring 223 may be electrically connected to each other through the via hole H4 on the display region A1.

The pad unit 220 may be disposed on the interlevel insulating layer 206 of the non-display region A2. The pad unit 220 may be formed of various conductive materials and may be formed of the same material as the source electrode 207, the drain electrode 208, and the wiring unit 221. The pad unit 220 may include three layers like the wiring unit 221. For example, the pad unit 220 may include three layers, that is, Ti—Al—Ti layers.

In addition, the pad unit 220 may be simultaneously formed with the source electrode 207 or the drain electrode 208 by using a patterning process.

The pad unit 220 may be connected to the bridge wiring 223 disposed on the non-display region A2. That is, since the pad unit 220 may be disposed on the interlevel insulating layer 206 and the bridge wiring 223 may be disposed on the gate insulating layer 204, the interlevel insulating layer 206 may be disposed between the pad unit 220 and the bridge wiring 223. A via hole H5 may be formed in the interlevel insulating layer 206, and, thus, the pad unit 220 and the bridge wiring 223 may be electrically connected to each other through the via hole H5 on the non-display region A2.

The pad unit 220 and the wiring unit 221 may be formed so as to be disconnected from each other but may be electrically connected to each other through the bridge wiring 223, as described above.

The insulating layer 215 may be formed on the interlevel insulating layer 206 so as to cover a TFT. The insulating layer 215 may include an opening 215a that is formed to overlap with a predetermined region of an upper surface of the first electrode 210.

The intermediate layer 212 may be formed to correspond to the opening 215a. The second electrode 216 may be formed on the intermediate layer 212.

The encapsulation unit 120 may be formed on the second electrode 216 so as to face one surface of the substrate 201. The encapsulation unit 120 may be formed to protect the intermediate layer 212 and the like from external moisture, air, or the like. As described above, the encapsulation unit 120 may include the first portion 120a formed on the display region A1 and the second portion 120b formed on the non-display region A2.

The first portion 120a may be formed by alternately stacking the first thin films 1201 and the second thin films 1202 on each other, and the second portion 120b may be formed by alternately stacking the first thin films 1211, 1221, and 1231 on each other.

The first thin films 1201 may be formed to surround ends of the second thin films 1202. That is, the second thin films 1212 and 1222 may be interposed between the first thin films 1211, 1221, and 1231, respectively, and may be respectively surrounded by the first thin films 1211, 1221, and 1231.

The first thin films 1211, 1221, and 1231 may be formed of an inorganic material and may function as a barrier layer. For example, the first thin films 1211, 1221, and 1231 may be formed of one of $AlO_x$, $Al_2O_3$, $SiN_x$, $Si_3N_4$, ZrO, Al-doped zinc oxide (AZO), and SiOx. In addition, the first thin films 1211, 1221, and 1231 may be formed as two or more layers formed of these materials. The first thin films 1211, 1221, and 1231 may be formed by one of thermal evaporation, E-beam evaporation, radio-frequency (RF) sputtering, reactive sputtering, atomic layer deposition (ALD), plasma enhanced chemical vapor deposition (PECVD), and the like.

The second thin films 1212 and 1222 may be formed of an organic material and may be formed as a planarization layer. For example, the second thin films 1212 and 1222 may be formed of one of an acrylic monomer, a silicon-based monomer, an epoxy-based monomer, and a polymer formed by hardening of the monomer formed by mixing at least one of the foregoing with a hardening agent. The second thin films 1212 and 1222 formed of a polymer formed by hardening acrylic monomer may be formed by thermal evaporation. The second thin films 1212 and 1222 may be formed to have a greater thickness than that of the first thin films 1211, 1221, and 1231.

According to an embodiment of the present invention, the pad unit 118 and the wiring unit 117 may not be connected directly to each other at a boundary between the display region A1 and the non-display region A2 but may be connected to each other through the bridge wiring 116 that is formed as a different layer from the pad unit 118 and the wiring unit 117, thereby preventing a liquid-state material of the second thin film 1212 or a diffused component of the second thin film 1212 from being introduced through the wiring unit 117 at the boundary between the display region A1 and the non-display region A2. This would damage the organic light-emitting devices 52, that is, the intermediate layer 112 including an emissive layer, during the formation of the second thin film 1212. In particular, embodiments of the present invention do not require any disconnection in the inorganic encapsulation layer 21, which is shown in FIG. 6 and may correspond to first thin film 1211 in the embodiments of FIGS. 4, 7, 8 and 10. Thus, unwanted intrusion of organic components or environmental contaminants through gaps in the inorganic encapsulation layer 21 may be prevented.

In addition, the pad unit 220 is simultaneously formed with the source electrode 207 or the drain electrode 208, thereby simplifying a manufacturing process and easily reducing the thickness of the organic light-emitting display device 200.

In addition, the first electrode 210 is formed of the same material at the same layer level as the first conductive layer 205a of the gate electrode 205, thereby simplifying a manufacturing process and reducing errors during the formation of the first electrode 210 and the gate electrode 205. In addition, the thickness of the organic light-emitting display device 200 may be easily reduced in comparison to more traditional designs in which the first electrode is formed above a TFT comprising a gate electrode and formed in a layer that is distinct from the one including the gate electrode.

According to the one or more embodiments of the present invention, impurities may be prevented from penetrating into an organic light-emitting display device through a boundary between an encapsulation unit and a pad unit.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting display device, comprising:
   a substrate on which a display region and a non-display region are defined;
   a first electrode disposed on the substrate;
   an intermediate layer disposed on the first electrode and comprising an organic light-emitting layer;
   a second electrode disposed on the intermediate layer;
   an encapsulation layer disposed on the substrate;
   a plurality of pad units disposed on the non-display region;
   a wiring unit disposed on the display region, the wiring unit and the plurality of pad units not being overlapped; and
   a bridge wiring that is disposed across the display region and the non-display region and connects one of the plurality of pad units and the wiring unit to each other.

2. The organic light-emitting display device of claim 1, the pad units and the wiring unit being formed at the same layer level.

3. The organic light-emitting display device of claim 1, the bridge wiring being formed on a different layer from any layer including a pad unit and the layer including the wiring unit.

4. The organic light-emitting display device of claim 1, the pad units and the wiring unit being formed on an interlevel insulating layer formed on the substrate.

5. The organic light-emitting display device of claim 4, further comprising a gate insulating layer formed between the substrate and the interlevel insulating layer, the bridge wiring being formed on the gate insulating layer.

6. The organic light-emitting display device of claim 1, the wiring unit being connected to the bridge wiring through a via hole in the display region.

7. The organic light-emitting display device of claim 1, one of the plurality of pad units being connected to the bridge wiring through a second via hole in the non-display region.

8. The organic light-emitting display device of claim 1, the encapsulation layer comprising a first portion comprising a first thin film and a second thin film that are alternately stacked on each other, the first portion being disposed on the substrate, the encapsulation layer further comprising a second portion comprising the first thin film only.

9. The organic light-emitting display device of claim 8, the first portion being disposed on the display region, the second portion being disposed on the non-display region and covering one of the plurality of pad units.

10. The organic light-emitting display device of claim 9, the second portion comprising an opening through which a portion of one of the plurality of pad units is exposed outward.

11. The organic light-emitting display device of claim 8, an end of the second thin film being surrounded by the first thin film.

12. The organic light-emitting display device of claim 8, the first thin film being formed of an inorganic material.

13. The organic light-emitting display device of claim 8, the second thin film being formed of an organic material.

14. The organic light-emitting display device of claim 1, further comprising a thin film transistor (TFT) that is disposed on the substrate, is electrically connected to the first electrode, and comprises an active layer, a source electrode, a drain electrode, and a gate electrode.

15. The organic light-emitting display device of claim 14, one of a pad unit of the plurality of pad units and the wiring unit being formed of the same material as one of the source electrode and the drain electrode, the one of a pad unit of the plurality of pad units and the wiring unit being formed at the same layer level as one of the source electrode and the drain electrode.

16. The organic light-emitting display device of claim 14, the first electrode and the gate electrode being formed at the same layer level.

17. The organic light-emitting display device of claim 16, the gate electrode comprising a first conductive layer and a second conductive layer formed on the first conductive layer, the first electrode being formed of the same material as the first conductive layer.

18. The organic light-emitting display device of claim 14, the bridge wiring being formed of the same material as the gate electrode and being formed at the same layer level as the gate electrode.

19. The organic light-emitting display device of claim 1, the first electrode comprising a transmissive conductive material.

20. An organic light-emitting display device, comprising:
a substrate on which a display region and a non-display region are defined;
a first electrode disposed on the substrate;
an intermediate layer disposed on the first electrode and comprising an organic light-emitting layer;
a second electrode disposed on the intermediate layer;
an encapsulation layer disposed on the substrate, the encapsulation layer comprising an encapsulation unit;
a plurality of pad units disposed on the non-display region;
a wiring unit disposed on the display region; and
a bridge wiring that is disposed across the display region and the non-display region and connects one of the plurality of pad units and the wiring unit to each other,
the wiring unit being connected to the bridge wiring through a first via hole in the display region,
the pad unit being connected to the bridge wiring through a second via hole in the non-display region, and
the encapsulation unit comprising a first portion comprising a first thin film and a second thin film that are alternately stacked on each other, the first portion being on the substrate, the encapsulation unit further comprising a second portion comprising the first thin film only.

21. The organic light-emitting display device of claim 20, the first via hole comprising a first inner surface portion facing the display region and a second inner surface portion facing the non-display region.

22. The organic light-emitting display device of claim 21, the second inner surface portion being formed closer to a central portion of the display region than is an external side surface of the second thin film that is positioned at an outermost portion of a plurality of the second thin films.

23. The organic light-emitting display device of claim 20, the second via hole comprising a third inner surface portion facing the display region and a fourth inner surface portion facing the non-display region.

24. The organic light-emitting display device of claim 23, the third inner surface portion being formed closer to a central portion of the display region than is an external side surface of the second thin film that is positioned at an outermost portion of a plurality of the second thin films.

* * * * *